(12) United States Patent
Hishinuma (10) Patent No.: US 10,921,548 B2
(45) Date of Patent: Feb. 16, 2021

(54) FOCUSING MECHANISM AND IMAGING MODULE

(71) Applicant: FUJIFILM Corporation, Tokyo (JP)

(72) Inventor: Yoshikazu Hishinuma, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 324 days.

(21) Appl. No.: 16/116,422

(22) Filed: Aug. 29, 2018

(65) Prior Publication Data

US 2018/0364449 A1 Dec. 20, 2018

Related U.S. Application Data (63) Continuation of application No. PCT/JP2017/011477, filed on Mar. 22, 2017.

(30) Foreign Application Priority Data

Mar. 29, 2016 (JP) ................................ 2016-065306

(51) Int. Cl.
*G02B 15/14* (2006.01)
*G02B 7/10* (2021.01)
(Continued)

(52) U.S. Cl.
CPC ................. *G02B 7/10* (2013.01); *G02B 7/02* (2013.01); *G02B 7/023* (2013.01); *G02B 7/026* (2013.01);
(Continued)

(58) Field of Classification Search
CPC ... G02B 7/10; G02B 7/04; G02B 7/02; G02B 7/023; G02B 7/026; G02B 7/08
See application file for complete search history.

(56) References Cited

U.S. PATENT DOCUMENTS 8,199,410 B2 6/2012 Haugholt et al.
8,711,495 B2 4/2014 Topliss
(Continued)

FOREIGN PATENT DOCUMENTS

JP 2004-001209 A 1/2004
JP 2010-210968 A 9/2010
(Continued)

OTHER PUBLICATIONS

International Search Report issued in PCT/JP2017/011477; dated Jul. 11, 2017.
(Continued)

*Primary Examiner* — Joseph P Martinez
(74) *Attorney, Agent, or Firm* — Studebaker & Brackett PC (57) ABSTRACT

A focusing mechanism includes: a driving source in which three or more cantilever-like piezoelectric actuators are radially arranged; and an optical lens unit that consists of an outer frame, an optical lens, a lens holder provided around the optical lens and holding the optical lens, and an elastic body connecting the lens holder to the outer frame and elongating and contracting in a radial direction of the optical lens, wherein surfaces of driving distal ends of the cantilever-like piezoelectric actuators, which are perpendicular to a direction of an optical axis of the optical lens, are in contact with the lens holder, and the cantilever-like piezoelectric actuators move the optical lens in the direction of the optical axis of the optical lens by the drive of the cantilever-like piezoelectric actuators to perform focusing.

9 Claims, 7 Drawing Sheets

(51) Int. Cl.
  *G02B 7/04* (2021.01)
  *G02B 7/02* (2021.01)
  *H01L 41/09* (2006.01)
  *H02N 2/00* (2006.01)
(52) U.S. Cl.
  CPC ............... *G02B 7/04* (2013.01); *H01L 41/09* (2013.01); *H02N 2/0075* (2013.01); *H01L 41/094* (2013.01)

(56) References Cited

U.S. PATENT DOCUMENTS

| | | | |
|---|---|---|---|
| 2003/0202735 A1 | 10/2003 | Dunec et al. | |
| 2005/0167769 A1* | 8/2005 | Dunec | B81B 3/0008 257/414 |
| 2010/0110571 A1* | 5/2010 | Ono | G02B 7/021 359/824 |
| 2010/0232043 A1 | 9/2010 | Hishinuma | |

FOREIGN PATENT DOCUMENTS

| | | | | |
|---|---|---|---|---|
| JP | 2011-141438 A | | 7/2011 | |
| JP | 2012-163415 | * | 8/2012 | ............ G01P 15/125 |
| JP | 2012-163415 A | | 8/2012 | |
| JP | 2013-068875 A | | 4/2013 | |
| WO | 2009/060575 A1 | | 5/2009 | |

OTHER PUBLICATIONS

Written Opinion issued in PCT/JP2017/011477; dated Jul. 11, 2017.
An Office Action mailed by the Japanese Patent Office dated Mar. 5, 2019, which corresponds to Japanese Patent Application No. 2018-509127 and is related to U.S. Appl. No. 16/116,422.

* cited by examiner

FOCUSING MECHANISM AND IMAGING MODULE

CROSS-REFERENCE TO RELATED APPLICATION

The present application is a Continuation of PCT International Application No. PCT/JP2017/011477 filed on Mar. 22, 2017, which claims priority under 35 U.S.C. § 119(a) to Japanese Patent Application No. 2016-065306 filed on Mar. 29, 2016. Each of the above applications is hereby expressly incorporated by reference, in its entirety, into the present application.

BACKGROUND

Technical Field

The present invention relates to a focusing mechanism and an imaging module that include a piezoelectric element and an optical lens.

Related Art

In recent years, cameras mounted on mobile phones and the like have had a focusing function as a standard. Most of systems for driving the cameras are voice coil motors (hereinafter, abbreviated as VCMs). However, there are problems that a VCM has high power consumption and a low driving speed and it is difficult to reduce the height of the VCM.

Accordingly, focusing mechanisms to which a micro electro mechanical systems (MEMS) technology and the like are applied as systems to be used instead of a VCM have been developed to achieve a reduction in size in recent years. For example, U.S. Pat. No. 8,711,495 discloses a method that uses an electrostatic actuator as a small drive mechanism for moving an optical lens. However, since the drive mechanism disclosed in U.S. Pat. No. 8,711,495 has a complicated structure to output a sufficient amount of displacement with a small size, manufacturing yield, drive durability, and the like become problems.

Further, U.S. Pat. No. 8,199,410 discloses a method that is not a method of performing focusing by moving an optical lens and uses a flexible material, such as a polymer, as the material of a lens and changes a focal length by deforming the lens. However, since the aberration of the lens deteriorates and optical characteristics deteriorate in this method, the quality of a taken image cannot help being compromised.

Furthermore, JP2013-68875A and JP2011-141438A disclose methods that use a liquid material for a drive system or a lens itself and deform the lens. However, a mechanism becomes complicated and it is expected that the quality of a photographic image is also inferior to a case in which a fixed optical lens is used.

Moreover, JP2010-210968A discloses an optical module that drives an optical lens by a piezoelectric film directly formed along the outer periphery of the optical lens.

SUMMARY

However, since the piezoelectric film is directly formed along the outer periphery of an optical element in the optical module disclosed in JP2010-210968A, the optical element is strongly restrained by the piezoelectric film. For this reason, there is a problem that it is difficult to output a large amount of displacement.

The invention has been made in consideration of the above-mentioned circumferences, and an object of the invention is to provide a focusing mechanism that can move an optical lens by a large amount of displacement with a simple structure and can be driven at a high speed and with low power consumption.

Further, an object of the invention is to provide an imaging module that can be driven at a high speed and with low power consumption by a simple structure without deteriorating image quality.

A focusing mechanism of the invention comprises: a driving source in which three or more cantilever-like piezoelectric actuators are radially arranged; and an optical lens unit that consists of an outer frame, an optical lens, a lens holder provided around the optical lens and holding the optical lens, and an elastic body connecting the lens holder to the outer frame and elongating and contracting in a radial direction of the optical lens. Surfaces of driving distal ends of the cantilever-like piezoelectric actuators, which are perpendicular to a direction of an optical axis of the optical lens, are in contact with the lens holder, and the cantilever-like piezoelectric actuators move the optical lens in the direction of the optical axis of the optical lens by the drive of the cantilever-like piezoelectric actuators to perform focusing.

It is preferable that the surface of each cantilever-like piezoelectric actuator perpendicular to a driving direction of the cantilever-like piezoelectric actuator is covered with a material having a coefficient of static friction of 0.5 or less.

It is preferable that the focusing mechanism further comprises a projection portion provided on the surface of each cantilever-like piezoelectric actuator perpendicular to the driving direction of the cantilever-like piezoelectric actuator and the projection portions are in contact with the lens holder.

The surface of the projection portion may be covered with a material having a coefficient of static friction of 0.5 or less.

The three or more cantilever-like piezoelectric actuators may be spirally and radially arranged.

It is preferable that each cantilever-like piezoelectric actuator is made of an isotropic material.

It is preferable that the isotropic material is polysilicon.

It is preferable that each cantilever-like piezoelectric actuator is formed of a thin film.

It is preferable that the elastic body is a bellows-like nitride film.

An imaging module of the invention comprises the focusing mechanism of the invention.

Here, "driving distal end of the cantilever-like piezoelectric actuator" means the distal end of the actuator where the maximum amount of displacement is obtained and a predetermined region that is positioned between the distal end and a predetermined position. The predetermined region is determined depending on the amount of displacement of the actuator, the structure of the lens holder, and the like.

According to the focusing mechanism of the invention, an optical lens can be moved by a large amount of displacement with a simple structure and the focusing mechanism can be driven at a high speed and with low power consumption.

Further, according to the imaging module of the invention, the imaging module can be driven at a high speed and with low power consumption by a simple structure without deteriorating image quality.

BRIEF DESCRIPTION OF THE DRAWINGS

Exemplary embodiments of the present invention will be described in detail based on the following figures, wherein.

(a) to (m) of FIG. 5 are schematic cross-sectional views showing a process for producing the driving source of the focusing mechanism of the invention.

(a) to (f) of FIG. 6 are schematic cross-sectional views showing a process for producing the optical lens unit of the focusing mechanism of the invention.

DETAILED DESCRIPTION

The invention will be described in detail below.

[Focusing Mechanism]

Figure 1:
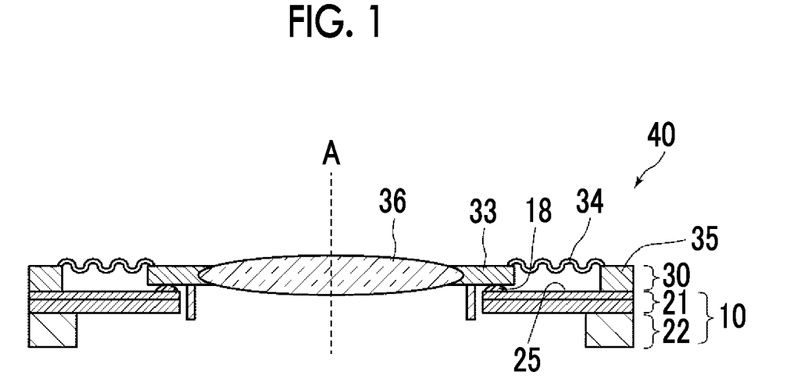
FIG. 1 is a schematic cross-sectional view showing an embodiment of a focusing mechanism of the invention.
Figure 2:
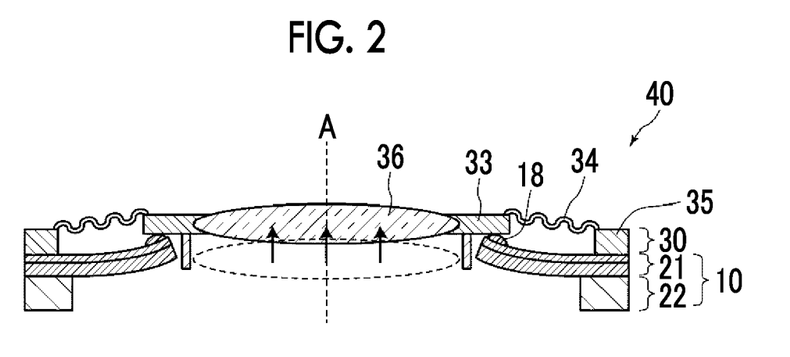
FIG. 2 is a schematic cross-sectional view showing the embodiment of the focusing mechanism of the invention at the time of driving.
Figure 3:
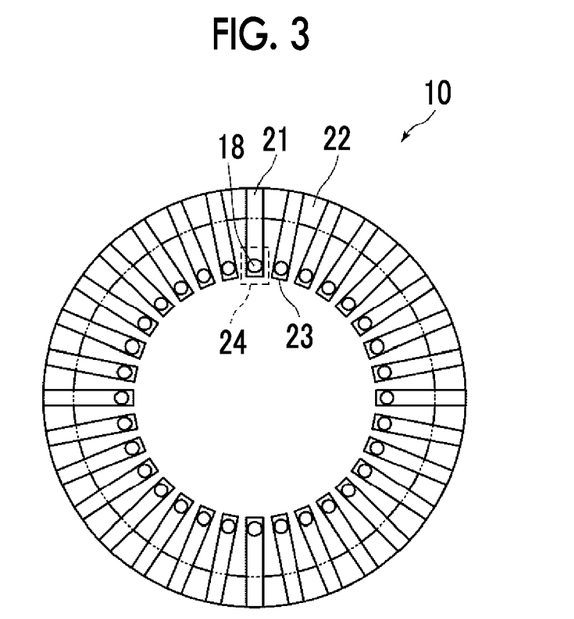
FIG. 3 is a schematic top view of a driving source of the focusing mechanism of the invention.
Figure 4:
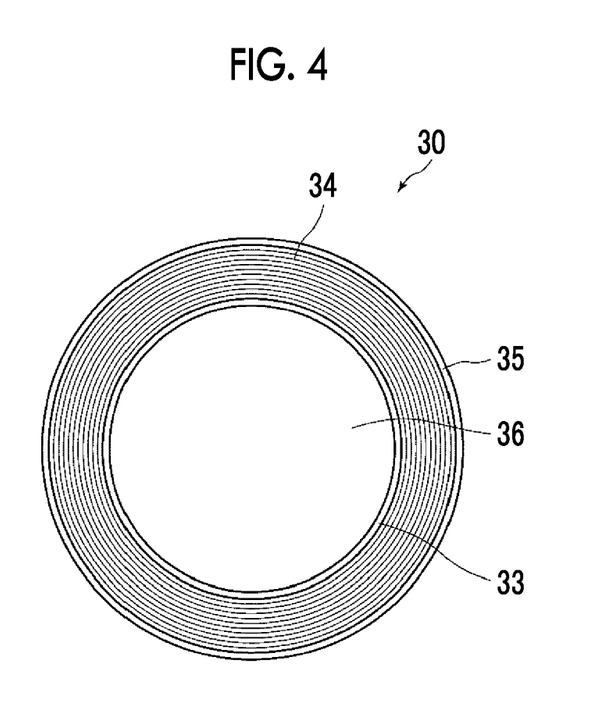
FIG. 4 is a schematic top view of an optical lens unit of the focusing mechanism of the invention.

First, an embodiment of a focusing mechanism of the invention will be described. FIG. 1 is a schematic cross-sectional view of the focusing mechanism of the invention to which a voltage is not applied. FIG. 2 is a schematic cross-sectional view of the focusing mechanism of the invention to which a voltage is applied. FIG. 3 is a schematic top view of a driving source. FIG. 4 is a schematic top view of an optical lens unit.

As shown in FIG. 1, the focusing mechanism 40 of the invention includes: a driving source 10 in which 32 cantilever-like piezoelectric actuators 21 (hereinafter, simply referred to as actuators) are radially arranged on a ring-shaped support 22; and an optical lens unit 30 that includes an outer frame 35, an optical lens 36, a lens holder 33 provided around the optical lens 36 and holding the optical lens 36, and an elastic body 34 connecting the lens holder 33 to the outer frame 35 and elongating and contracting in a radial direction of the optical lens.

Surfaces 25 of driving distal ends 24 of the actuators 21, which are perpendicular to the direction of an optical axis of the optical lens, are in contact with the lens holder 33, and the actuators 21 move the optical lens 36 in the direction A of the optical axis of the optical lens 36 by the drive of the actuators 21 to perform focusing.

As shown in FIG. 2, in a case in which a voltage is applied to a pair of electrodes of each actuator 21, the actuators 21 of the focusing mechanism 40 of the invention are warped toward the upper surface (the upper side in FIG. 2) by a unimorph effect. Accordingly, the optical lens 36 is lifted in the direction A of the optical axis through projection portions 18. Since the optical lens 36 is supported by the elastic body 34, the optical lens 36 can be quickly moved without being restrained.

(Driving Source)

Next, the driving source will be described in more detail.

As shown in FIG. 3, the driving source 10 includes 32 rectangular actuators 21 that are radially arranged. In this embodiment, the actuators 21 are radially arranged on the ring-shaped support 22 serving as a common support. As shown in FIG. 1, the projection portion 18 is provided on the surface 25 of the driving distal end 24 of each actuator 21 that is perpendicular to the direction A of the optical axis of the optical lens. The projection portions 18 are in contact with the lens holder 33 of the optical lens unit 30. Since the projection portions 18 are provided, the actuators 21 are in point contact with the lens holder 33. Accordingly, a reduction in the amount of displacement caused by friction can be improved. In this embodiment, the projection portions 18 are further covered with a material having a coefficient of static friction of 0.5 or less (not shown). Since the projection portions 18 are covered with a material having a coefficient of static friction of 0.5 or less, the actuators 21 slide on the lens holder 33 well at the time of driving. For this reason, structural restraint hardly occurs. Since the restraint of the optical lens is strong in the drive of the actuator in a diaphragm or beam type structure that is the related art, the amount of displacement of the optical lens is significantly reduced. For this reason, the amount of displacement of the optical lens required for focusing cannot be achieved. Since the optical lens is supported by a low friction material having a coefficient of static friction of 0.5 or less as described above, a large amount of displacement of the optical lens can be ideally achieved.

A form in which the projection portions 18 are provided has been described in this embodiment, but the projection portions may not be formed. In this case, it is preferable that a material having a coefficient of static friction of 0.5 or less is applied to the surface 25 (see FIG. 1) of the driving distal end 24 perpendicular to the direction A of the optical axis of the optical lens by sputtering or the like. The low friction material may be provided on the entire surface 25 and may be provided on only the driving distal ends 24.

(Optical Lens Unit)

Next, the optical lens unit will be described in more detail.

As shown in FIG. 4, the optical lens unit 30 includes the outer frame 35, the optical lens 36, the lens holder 33 that is provided around the optical lens 36 and holds the optical lens 36, and the elastic body that connects the lens holder 33 to the outer frame 35 and elongates and contracts in the radial direction of the optical lens. The elastic body 34 is formed on the entire circumference of the optical lens 36 and has a bellows structure that elongates and contracts in the radial direction of the optical lens.

As shown in FIG. 1, the back of the lens holder 33 of the optical lens unit 30 is in contact with the projection portions 18 of the driving source 10. Further, the optical lens unit 30 is pressed toward the driving source 10 by the elastic body 34 so that the optical lens 36 and the lens holder 33 do not fall due to gravity or an inertial force or so that the optical axis of the optical lens 36 does not deviate.

The elastic body 34 is formed of, for example, a silicon nitride film that is formed integrally with the lens holder 33 and the outer frame 35 and has a bellows structure. A bellows structure using a microfabrication technology has been used as the elastic body in this embodiment. However, for example, a plurality of springs, which are produced using an injection molding technology, may be used as the elastic body. In this case, the elastic body may not be formed on the entire circumference of the optical lens and a plurality of elastic bodies may be radially arranged.

(Method of Producing Driving Source)

Next, a method of manufacturing the driving source 10 will be described. (a) to (m) of FIG. 5 are schematic cross-sectional views showing a process for producing the driving source of an embodiment.

Figure 5:
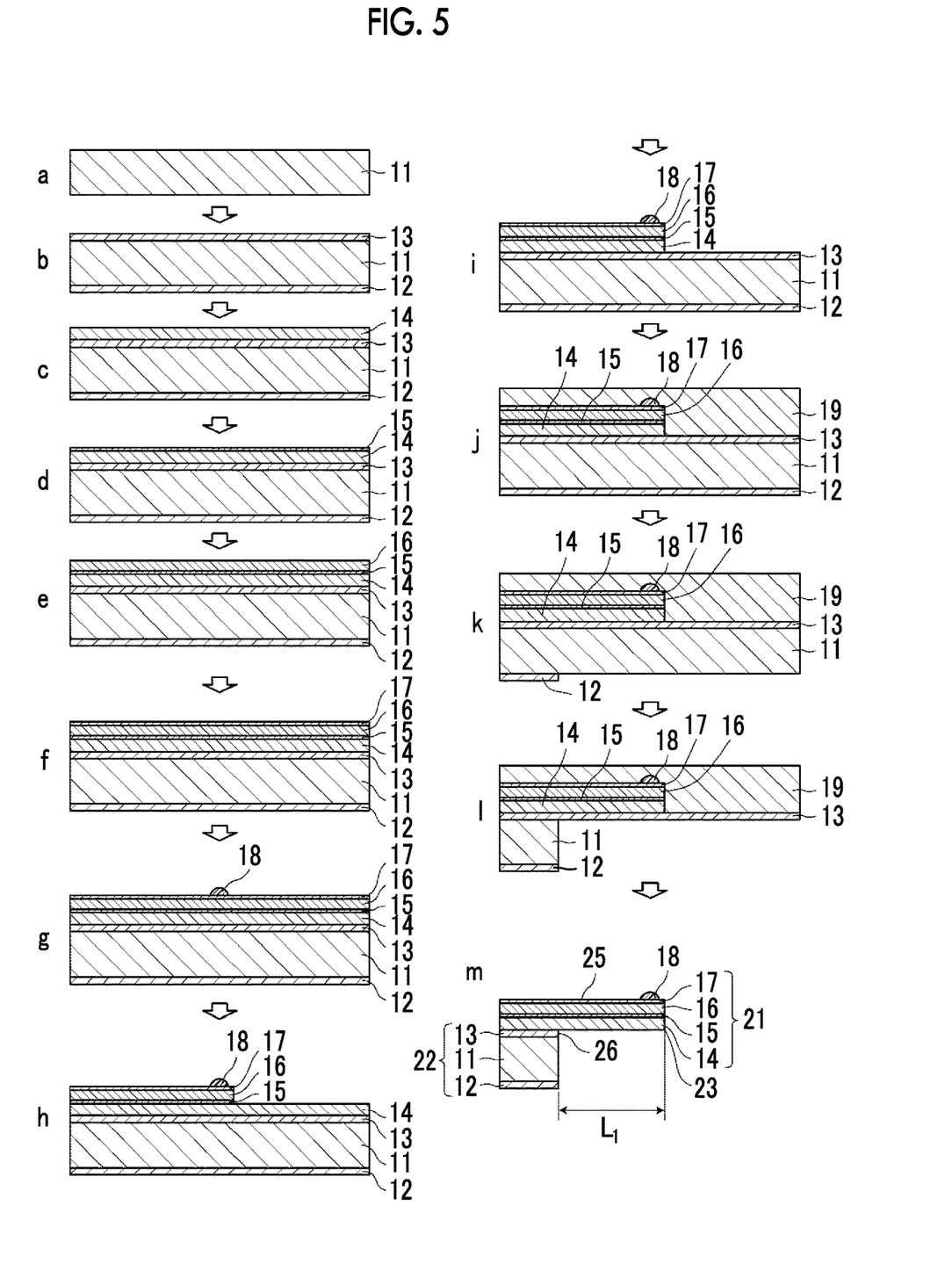

As shown in (a) of FIG. 5, a silicon substrate 11 is prepared first. Since the silicon substrate 11 serves as a support for the plurality of cantilever-like piezoelectric actuators, it is preferable in terms of preventing the deformation of the entire structure by the drive of the actuators that the thickness of the silicon substrate 11 is in the range of, for example, 300 µm to 800 µm. The substrate is not limited to the silicon substrate, and examples of the substrate include substrates made of glass, stainless steel, yttrium-stabilized zirconia (YSZ), alumina, sapphire, silicon carbide, and the like.

After that, thermal oxide films (oxide silicon) 12 and 13 are formed on the surface and back of the silicon substrate 11 as shown in (b) of FIG. 5. The thermal oxide films 12 and 13 have a function as an etching stopper. In terms of the function and manufacturing cost of the etching stopper, it is preferable that the thickness of the thermal oxide film is in the range of 0.5 µm to 3 µm.

Then, as shown in (c) of FIG. 5, a polysilicon film 14 is formed on the surface of the thermal oxide film 13, which faces the side where the optical lens unit is disposed, by a chemical vapor deposition (CVD) method. In terms of, for example, stiffness required to drive the lens and the amount of displacement, it is preferable that the thickness of the polysilicon film 14 is in the range of 5 µm to 30 µm.

It is preferable that crystalline silicon is avoided and isotropic materials, such as polysilicon, amorphous silicon, and amorphous silicon carbide, are used as the main material of the actuator 21. Since crystalline silicon is an anisotropic material, a variation occurs in the stiffness of the actuator in a case in which cantilever-like piezoelectric actuators formed of radially arranged actuators are produced. For this reason, since a difference occurs between the actuators in the amount of displacement of the optical lens at the time of driving even though the same voltage is applied to all the actuators, the lens cannot be moved in parallel with a plane perpendicular to the direction of the optical axis. Accordingly, it is preferable that an isotropic material, such as polysilicon, is used as the main material of the actuator 21.

After that, a lower electrode 15, a ferroelectric thin film 16, and an upper electrode 17 are sequentially formed on the polysilicon film 14 by a sputtering method (see (d), (e), and (f) of FIG. 5).

It is preferable that one or two or more perovskite oxides expressed by the composition formula (1) are used for the ferroelectric thin film 16.

$$Pb_x(Zr_y,Ti_z,M_{b-y-z})O_c \quad (1)$$

In the formula, M includes at least one element selected from a group consisting of V, Nb, Ta, Sb, Cr, Mo, W, Mn, Mg, Sc, Co, Cu, In, Sn, Ga, Zn, Cd, Fe, Ni, Hf, and Al. x, y, and z satisfies the relationships of "0<y<b", "0<z<b", and "0≤b-y-z".

Further, "x:b:c=1:1:3" is a standard, but these molar ratios may be out of reference molar ratios in a range from which a perovskite structure is taken.

A perovskite oxide, which can be expressed by the composition formula (1), includes Nb as M of the composition formula, and a molar ratio of Nb/(Zr+Ti+M) may be in the range of 0.10 to 0.20 and it is more preferable that a molar ratio of Nb/(Zr+Ti+M) is in the range of 0.10 to 0.15.

Examples of a preferred method of forming the ferroelectric thin film 16 include vapor growth methods, such as a sputtering method, a plasma CVD method, a metal organic chemical vapor deposition (MOCVD) method, a burning-quenching etching method, an annealing-etching method, and a thermal spraying-quenching method. A sputtering method is particularly preferred among these methods.

Examples of materials of the lower and upper electrodes 15 and 17 are not particularly limited, and include metals or metal oxides, such as Au, Pt, Ir, Ti, IrO$_2$, RuO$_2$, LaNiO$_3$, SrRuO$_3$, an indium tin oxide (ITO), and TiN, and combinations thereof.

The thickness of each of the lower and upper electrodes 15 and 17 is not particularly limited, and is, for example, about 200 nm. The thickness of the ferroelectric thin film 16 is not particularly limited, is usually 1 µm or more, and is in the range of, for example, 1 µm to 5 µm. It is preferable that the thickness of the ferroelectric thin film 16 is 3 µm or more.

After that, as shown in (g) of FIG. 5, the projection portions 18 are formed in regions that form the driving distal ends of the actuators. The projection portions 18 are in contact with the lens holder 33 of the optical lens unit 30. It is possible to form the projection portions 18 by, for example, jetting a UV curable resin material through ink jet for material deposition and then curing dropped liquid droplets through UV irradiation. Examples of the UV curable resin material may include a low-viscosity urethane acrylate resin. Further, in terms of preventing a reduction in the amount of displacement caused by friction between the lens holder 33 and the projection portion 18, it is preferable that the surface of the projection portion 18 is covered with a material having a coefficient of static friction of 0.5 or less. Furthermore, the projection portion itself may be made of a material having a coefficient of static friction of 0.5 or less.

Examples of the material having a coefficient of static friction of 0.5 or less may include a fluorine resin, such as Teflon (registered trademark. Hereinafter, this will be omitted), graphite, molybdenum disulfide, diamond-like carbon (DLC), polyethylene, polystyrene, and the like.

In this specification, a coefficient of static friction is a value that is measured by a measurement method based on ISO 8295.

Then, lithography for patterning the actuators 21 is performed, and the upper electrode 17, the ferroelectric thin film 16, the lower electrode 15, and the polysilicon film 14 are etched by dry etching (see (h) and (i) of FIG. 5).

After that, as shown in (j) of FIG. 5, for the purpose of working on the back of the silicon substrate 11, each actuator is protected over the thermal oxide film 13 from the surface of each actuator by a resist 19.

Then, lithography for performing silicon depth etching is performed from the back, the thermal oxide film 12 is removed by wet etching, and the deep-digging of the silicon substrate 11 is performed by Bosch process-dry etching. The thermal oxide film 13 serves as an etching stop layer (see (k) and (l) of FIG. 5).

After that, as shown in (m) of FIG. 5, the exposed thermal oxide film 13 is removed by vapor hydrogen fluoride (HF) etching and the protective resist 19 is removed by ashing.

Lastly, a film made of Teflon is formed on the surface of each actuator by sputtering to reduce a coefficient of friction. In a case in which the projection portion is covered with a material having a coefficient of static friction of 0.5 or less, it is preferable in terms of abrasion resistance and the prevention of the peeling of the film caused by residual stress that the thickness of the film formed by sputtering is in the range of 40 nm to 500 nm.

Here, the length of the cantilever-like piezoelectric actuator means the length of a region of the actuator 21, which is not supported by the support 22, in the direction of a long side to the driving distal end face of the actuator from the end portion of the support. In this embodiment, the length of the cantilever-like piezoelectric actuator means a distance $L_1$ between an end portion 26 of the support 22 and a distal end face 23 of the actuator 21 as shown in (m) of FIG. 5.

A form in which 32 rectangular actuators 21 having the same length and the same shape are radially arranged has been described in regard to the driving source 10 of the embodiment, but the number of the cantilever-like piezoelectric actuators 21 having the same length and the same shape may be 3 or more and it is preferable that the cantilever-like piezoelectric actuators 21 are arranged at regular intervals. In terms of moving the optical lens in the direction of the optical axis in parallel with a high accuracy, the number of the cantilever-like piezoelectric actuators 21 having the same length and the same shape is preferably in the range of 4 to 150 and is more preferably in the range of 8 to 100.

In a case in which a plurality of cantilever-like piezoelectric actuators having different lengths are arranged, the amounts of displacement of the cantilever-like piezoelectric actuators are different from each other. For this reason, it is preferable that each actuator is designed to move the optical lens as an object to be moved by the drive of the actuators in parallel with the direction of the optical axis in a case in which all the actuators are driven.

Further, a shape in which the cantilever-like piezoelectric actuators are arranged may be a shape in which the cantilever-like piezoelectric actuators are radially arranged around the center of a circle as in this embodiment, and may be a shape in which the cantilever-like piezoelectric actuators are spirally and radially arranged (the case of Example 2 to be described later). The actuators may be arranged so that the driving distal ends of the plurality of actuators form a circle to hold the circular optical lens.

(Method of Producing Optical Lens Unit)

Next, a method of manufacturing the optical lens unit 30 will be described. The optical lens unit 30 can be produced using an ordinary lithography technology. (a) to (f) of FIG. 6 are schematic cross-sectional views showing a process for producing the optical lens unit 30.

Figure 6:
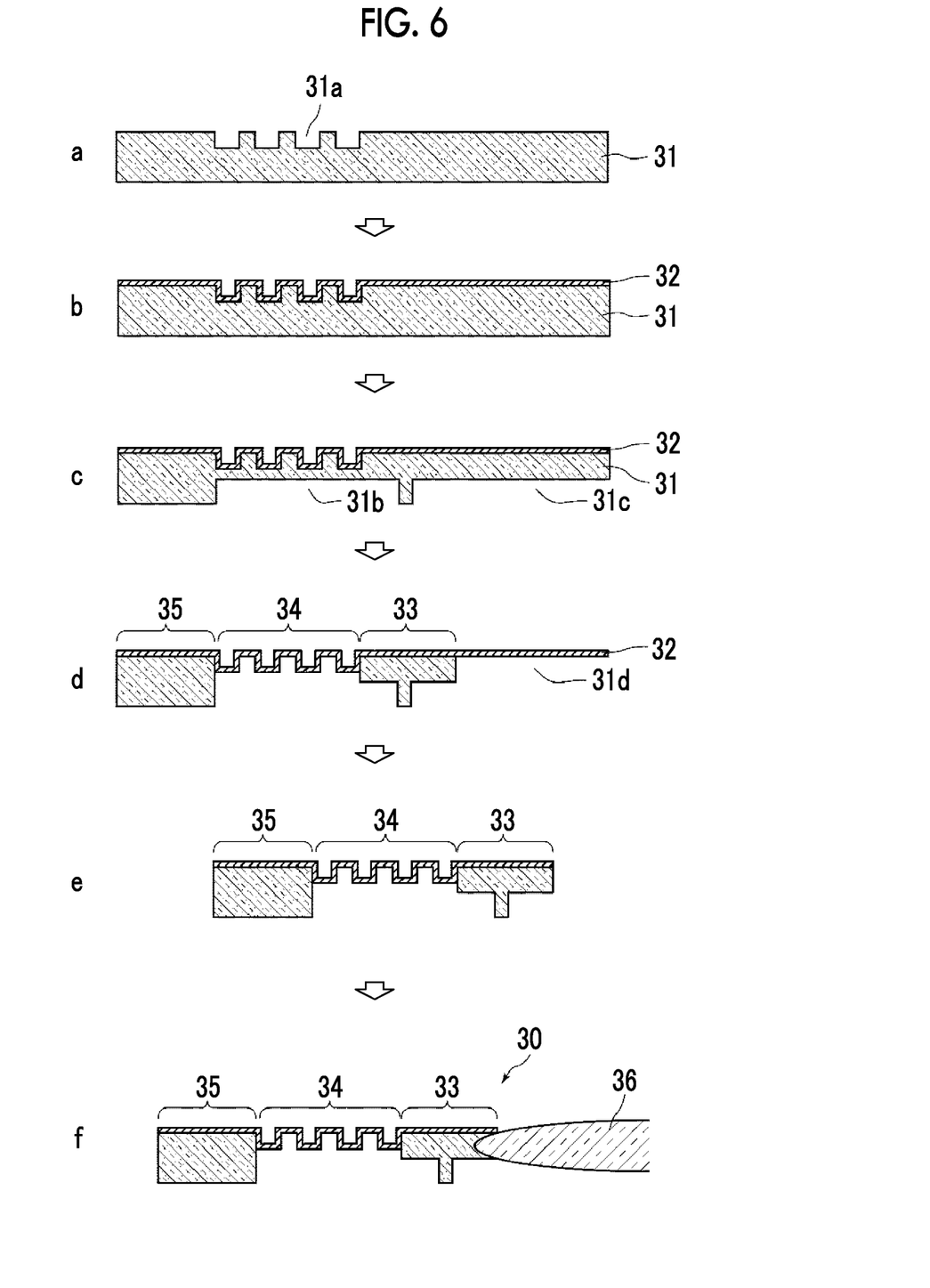

As shown in (a) of FIG. 6, a silicon substrate 31 is prepared and an uneven structure 31a is formed in a region where the elastic body is to be formed. The depth of the recessed portion varies depending on a material to be used. However, in terms of using the displacement of the actuator 21 at a maximum and allowing the optical lens to be in a state in which the optical lens is pressed toward the driving source 10 not to fall due to gravity or an inertial force, the depth of the recessed portion is preferably in the range of 0.5 μm to 50 μm and is preferably in the range of about 1 μm to 10 μm. Further, the period of the recessed portion and the protruding portion is more preferably in the range of 1 μm to 100 μm and is more preferably in the range of about 2 μm to 20 μm.

Glass, stainless steel, yttrium-stabilized zirconia, alumina, sapphire, silicon carbide, and the like can be used other than silicon for the substrate.

Further, it is preferable that the thickness of the silicon substrate 31 is in the range of, for example, about 300 μm to 800 μm.

After that, as shown in (b) of FIG. 6, a silicon nitride film 32 is formed on the surface of the silicon substrate where the uneven structure 31a is formed. The silicon nitride film 32 forms the elastic body. In terms of allowing the silicon nitride film to have strength and an elastic force, the thickness of the silicon nitride film is preferably in the range of 0.1 μm to 2 μm and is more preferably in the range of 0.2 μm to 1 μm.

Then, a back portion of the silicon substrate 31 of a region 31b where the elastic body 34 is to be formed and a back portion of the silicon substrate 31 of a region 31c where the optical lens 36 is to be disposed are removed by dry etching in two stages (see (c) and (d) of FIG. 6). In this case, the silicon nitride film 32 functions as a stopper. A film including at least one of oxide silicon, Al, Ni, Au, or Cu can be used other than silicon nitride as the material of the elastic body.

In addition, as shown in (e) of FIG. 6, a portion 31d of the silicon nitride film 32 where the optical lens is to be disposed is removed so that the lens holder 33, the elastic body 34, and the outer frame 35 are formed. Lastly, as shown in (f) of FIG. 6, the optical lens 36, which is separately produced, is fixed to the lens holder 33 by an adhesive. It is preferable that an epoxy-based die-bond resin, a fluorine-based die-bond resin, a silicon-based die-bond resin, and the like not affecting the function of the optical lens are used as the adhesive.

(Method of Producing Focusing Mechanism)

The lens holder 33 of the optical lens unit 30 is disposed so as to be in contact with the projection portions 18 of the driving source 10 produced as described above, and the outer frame 35 of the optical lens unit is bonded to the actuator 21 by an adhesive. It is preferable that an epoxy-based die-bond resin is used as the adhesive.

[Imaging Module]

Figure 7:
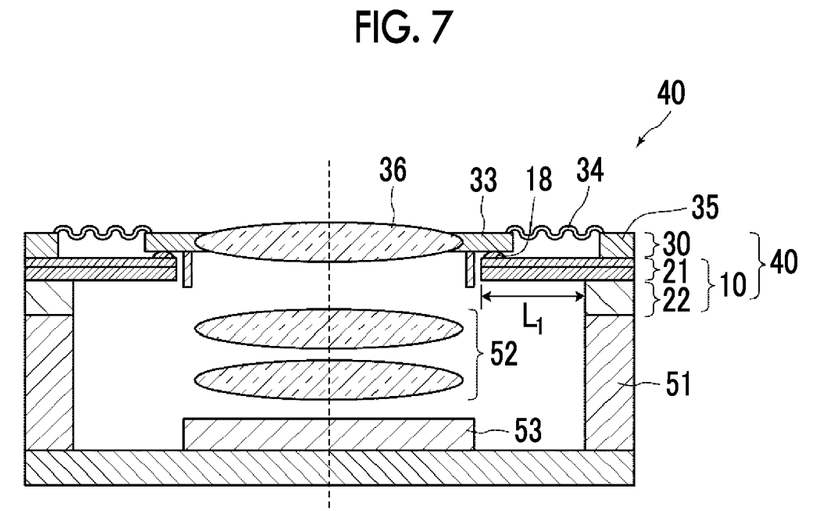
FIG. 7 is a schematic cross-sectional view of an imaging module that uses the focusing mechanism of the invention.

Next, an embodiment of an imaging module using the focusing mechanism of the invention will be described. FIG. 7 is a schematic cross-sectional view showing the embodiment of the imaging module.

As shown in FIG. 7, the focusing mechanism 40 of the invention including the driving source 10 and the optical lens unit 30 is fixed to a housing 51, in which a fixed lens group 52 and an imaging element 53 are disposed, by an adhesive. As a result, the imaging module 50 of this embodiment is formed.

The optical lens 36 of the optical lens unit 30 is moved in the direction A of the optical axis by the drive of the cantilever-like piezoelectric actuators 21 and functions as a focusing lens. An object to be imaged, which is positioned at any distance, is subjected to focusing by the optical lens 36, which functions as a focusing lens, and the fixed lens group 52, and an optical image is formed on the imaging element 53.

Since the imaging module including the focusing mechanism of the invention uses the cantilever-like piezoelectric actuators each of which is formed of a thin film as described above, the imaging module can achieve a reduction in size and low power consumption. In addition, since the driving source and the optical lens are in point contact with each other without being fixed to each other and the optical lens is supported by the elastic body, the optical lens can be quickly moved in the direction of the optical axis. As described above, the imaging module including the focusing mechanism of the invention can be driven at a high speed and with low power consumption without deteriorating image quality.

Figure 8:
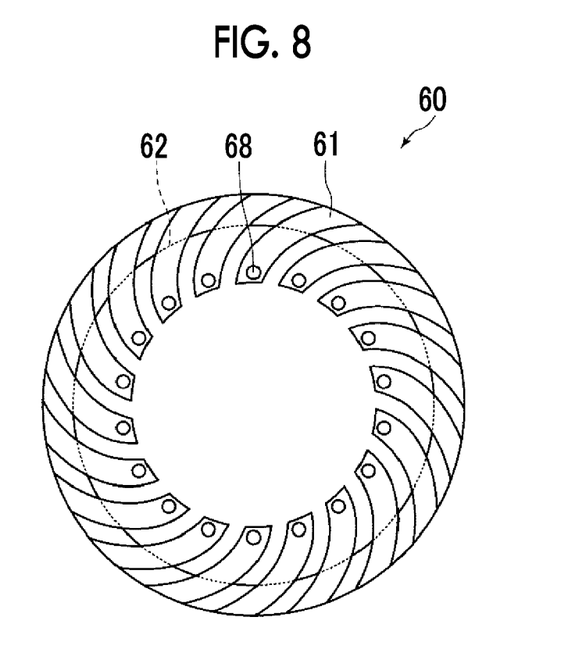
FIG. 8 is a schematic top view of a driving source of another embodiment of the focusing mechanism of the invention.
Figure 9:
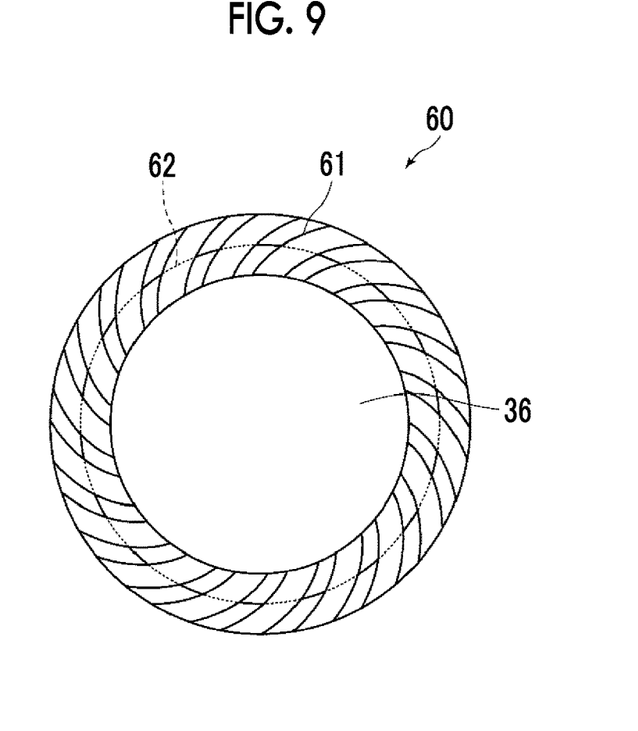
FIG. 9 is a schematic top view showing a state in which the optical lens is disposed on the driving source of another embodiment of the focusing mechanism of the invention.

A driving source in which the actuators are radially arranged has been described as the driving source of the focusing mechanism of the embodiment, but a driving source in which actuators are spirally and radially arranged may be used other than this driving source. FIG. 8 is a schematic top view of the driving source. FIG. 9 is a schematic top view showing a state in which the optical lens is disposed on the driving source.

As shown in FIG. 8, a driving source 60 includes 18 actuators 61 that have the same shape and the same length and are spirally and radially arranged on a ring-shaped support 62. The actuator 61 has a shape where the end face of the actuator 61 in a longitudinal direction forms an arc. As in the driving source 10, a projection portion 68 is provided on the surface of a driving distal end of each actuator 61 that is perpendicular to the direction of the optical axis of the optical lens. Further, the optical lens 36 is disposed so that the projection portions 68 are in contact with the lens holder 33 of the optical lens unit 30 (see FIG. 9). The holder, the elastic body, and the outer frame are not shown in FIG. 9.

Figure 10:
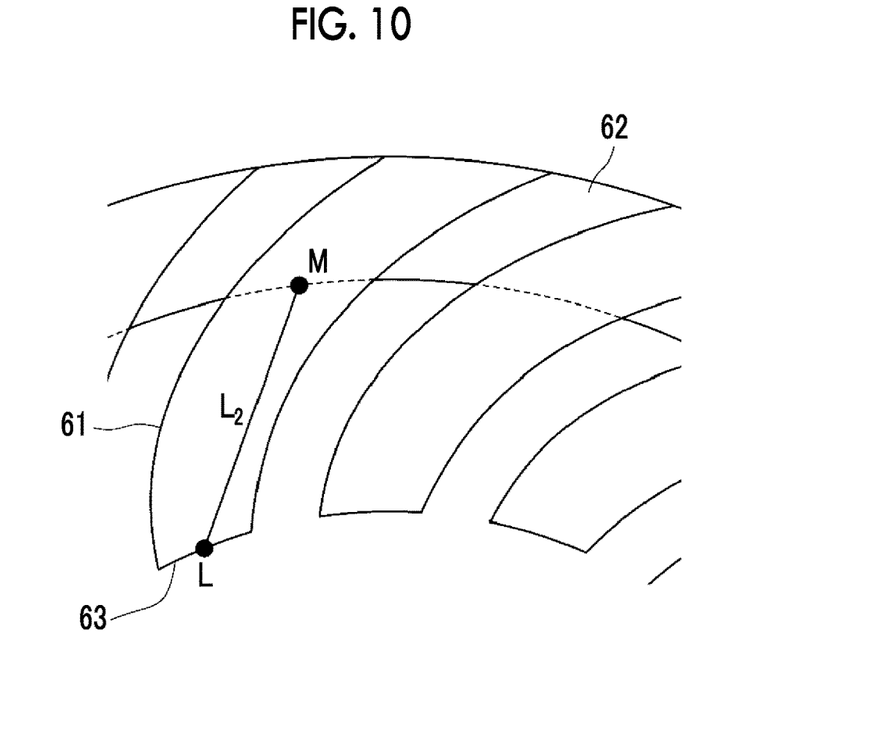
FIG. 10 is an enlarged schematic view of the driving source showing the length of an actuator that is spirally and radially arranged.

Here, the length of the actuator 61, which is spirally and radially arranged as described above, is defined as the length of a straight line $L_2$ connecting the center L of the distal end face 63 of the actuator 61 to the center M of the end portion of the actuator 61, which is in contact with the support 62, as shown in FIG. 10.

Since the actuators are formed in this shape and are arranged in this way, a long piezoelectric element can be formed in a narrow region and a large amount of displacement can be obtained without an increase in the size of the entire focusing mechanism (without a reduction in the size of the optical lens).

EXAMPLES

Example 1

A driving source and an optical lens unit were produced under the following conditions by the producing method described in the embodiment, and the driving source and the optical lens unit were bonded to each other by an adhesive to produce the focusing mechanism.

(Driving Source)
Silicon substrate: diameter of 150 mm and thickness of 350 μm
Thermal oxide film: thickness of 0.5 μm
Polysilicon film: thickness of 10 μm
Lower electrode: Ti (thickness of 20 nm)/Ir (thickness of 100 nm)
Upper electrode: Ir (thickness of 100 nm)
Piezoelectric film: lead zirconate titanate (PZT in which Nb is added to B-site by 12%), thickness of 3 μm
Length $L_1$ of cantilever-like piezoelectric actuator: 1 mm
Material of projection portion: UV curable low-viscosity urethane acrylate resin
Material covering projection portion: Teflon (coefficient of static friction of 0.1)
(Optical Lens Unit)
Silicon substrate: diameter of 150 mm and thickness of 350 μm
Silicon nitride film: 1 μm
Size of optical lens: diameter of 2.5 mm Example 2

A focusing mechanism of Example 2 is the same as that of Example 1 except that the driving source 60 is used.

The length $L_2$ of a cantilever-like piezoelectric actuator 61 of a driving source of Example 2 was set to 2 mm. The other structures of the driving source are the same as those of the Example 1.

(Evaluation)

A voltage in the range of 0 V to 30 V was applied to the focusing mechanism produced as described above and the amount of displacement of the optical lens in the direction of the optical axis of the optical lens was measured by the following measurement method.

Method of measuring the amount of displacement of lens

A difference between the height of the center of the lens 36 and the height of the outer frame 35 was statically measured at each applied voltage by a white-light-interference shape measuring device and a value measured at a voltage of 0 V was set to 0.

Figure 11:
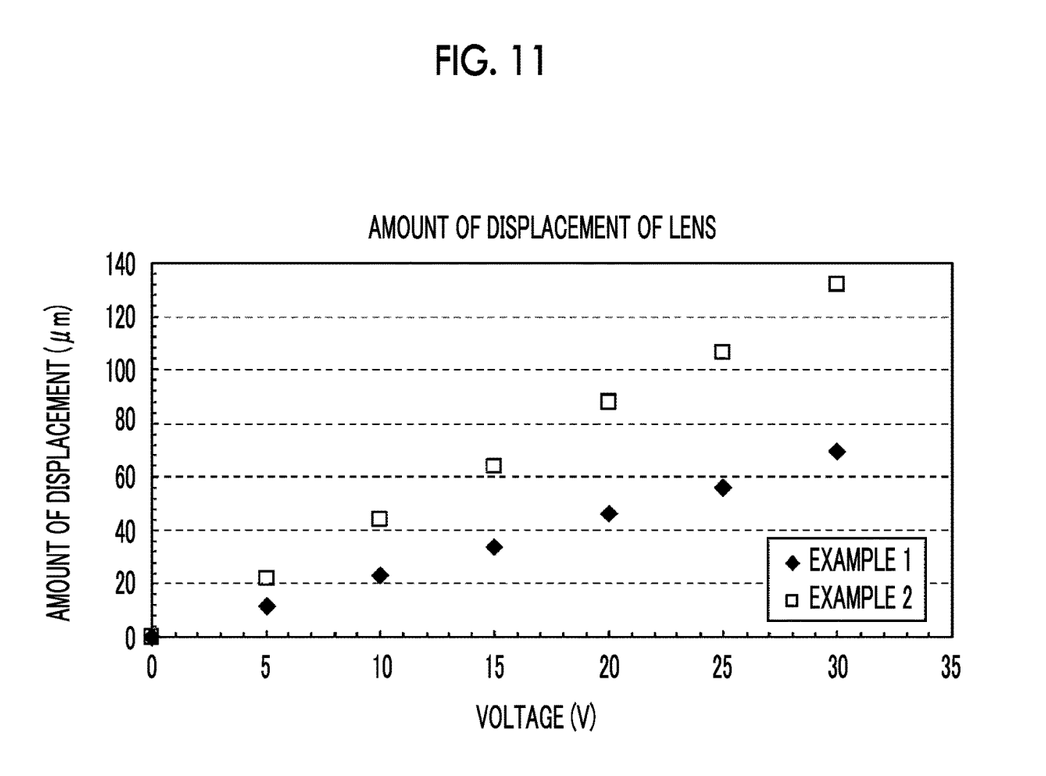
FIG. 11 is a graph showing the voltages of Examples and the amount of displacement of the optical lens.

The measurement results of Examples 1 and 2 are shown in FIG. 11.

As shown in FIG. 11, the focusing mechanism of the invention obtained the amount of displacement in the range of 50 to 100 μm at a voltage in the range of 20 V to 30 V. Particularly, the amount of displacement about double the amount of displacement of Example 1 in which the length of the cantilever-like piezoelectric actuator was 1 mm was obtained at an applied voltage of 30V in Example 2 in which the length of the actuator was 2 mm

What is claimed is:

1. A focusing mechanism comprising:
    a driving source in which three or more cantilever-like piezoelectric actuators are radially arranged; and
    an optical lens unit that consists of an outer frame, an optical lens, a lens holder provided around the optical lens and holding the optical lens, and an elastic body connecting the lens holder to the outer frame and elongating and contracting in a radial direction of the optical lens,
    wherein surfaces of driving distal ends of the cantilever-like piezoelectric actuators, which are perpendicular to a direction of an optical axis of the optical lens, are in contact with the lens holder, and the cantilever-like piezoelectric actuators move the optical lens in the direction of the optical axis of the optical lens by the drive of the cantilever-like piezoelectric actuators to perform focusing, and
    the surface of each cantilever-like piezoelectric actuator perpendicular to a driving direction of the cantilever-like piezoelectric actuator is covered with a material having a coefficient of static friction of 0.5 or less.

2. The focusing mechanism according to claim 1, further comprising:
    a projection portion that is provided on the surface of each cantilever-like piezoelectric actuator perpendicular to the driving direction of the cantilever-like piezoelectric actuator,
    wherein the projection portions are in contact with the lens holder.

3. The focusing mechanism according to claim 2,
    wherein the surface of the projection portion is covered with a material having a coefficient of static friction of 0.5 or less.

4. The focusing mechanism according to claim 1,
    wherein the three or more cantilever-like piezoelectric actuators are spirally and radially arranged.

5. The focusing mechanism according to claim 1,
    wherein each cantilever-like piezoelectric actuator is made of an isotropic material.

6. The focusing mechanism according to claim 5, wherein the isotropic material is polysilicon.
7. The focusing mechanism according to claim 1, wherein each cantilever-like piezoelectric actuator is formed of a thin film.
8. The focusing mechanism according to claim 1, wherein the elastic body is a bellows-like nitride film.
9. An imaging module comprising:
the focusing mechanism according to claim 1.

* * * * *